(12) United States Patent
Guo

(10) Patent No.: US 10,756,072 B2
(45) Date of Patent: Aug. 25, 2020

(54) CONDUCTIVE WIRE THROUGH-MOLD CONNECTION APPARATUS AND METHOD

(71) Applicant: Intel Corporation, Santa Clara, CA (US)

(72) Inventor: Mao Guo, Shanghai (CN)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/777,855

(22) PCT Filed: Dec. 25, 2015

(86) PCT No.: PCT/CN2015/098870
§ 371 (c)(1),
(2) Date: May 21, 2018

(87) PCT Pub. No.: WO2017/107176
PCT Pub. Date: Jun. 29, 2017

(65) Prior Publication Data
US 2018/0374832 A1 Dec. 27, 2018

(51) Int. Cl.
H01L 25/10 (2006.01)
H01L 23/31 (2006.01)
(Continued)

(52) U.S. Cl.
CPC ........ H01L 25/105 (2013.01); H01L 23/3128 (2013.01); H01L 23/49811 (2013.01);
(Continued)

(58) Field of Classification Search
CPC ....... H01L 25/105; H01L 24/48; H01L 25/50; H01L 24/16; H01L 23/5389
(Continued)

(56) References Cited

U.S. PATENT DOCUMENTS 8,288,873 B2   10/2012  Kang et al.
2009/0146301 A1  6/2009  Shimizu et al.
(Continued)

FOREIGN PATENT DOCUMENTS

CN  102222663  10/2011
CN  102738094  10/2012
(Continued)

OTHER PUBLICATIONS

International Search Report and Written Opinion for International Patent Application No. PCT/CN2015/098870 dated Aug. 26, 2016, 13 pgs.
(Continued)

Primary Examiner — Bo Fan
(74) Attorney, Agent, or Firm — Schwabe, Williamson & Wyatt, P.C.

(57) ABSTRACT

A microelectronic structure (200) and a fabrication method of microelectronic are described. A first package (10) has a first conductive pad (40, 41, 47, 48) formed on a first foundation layer (12). A loop of conductive wire (50-53) is wirebonded to the first conductive pad ((40, 41, 47, 48) of the first foundation layer (12). A mold cap (70) is formed on the first foundation layer (12). A via (90-93) is formed in the mold cap (70) to reach the conductive wire (50-53). A solder structure (80-83) is coupled to the conductive wire (50-53). A second package (100) is connected to the first package (10) by attaching a second solder structure (110-113) of a second package (100) to the first solder structure (80-83) of the first package (10).

12 Claims, 23 Drawing Sheets

(51) Int. Cl.
   *H01L 23/498*   (2006.01)
   *H01L 23/538*   (2006.01)
   *H01L 23/00*    (2006.01)
   *H01L 25/00*    (2006.01)
(52) U.S. Cl.
   CPC ...... *H01L 23/5383* (2013.01); *H01L 23/5389* (2013.01); *H01L 24/16* (2013.01); *H01L 24/48* (2013.01); *H01L 25/50* (2013.01); *H01L 24/13* (2013.01); *H01L 2224/13101* (2013.01); *H01L 2224/16225* (2013.01); *H01L 2224/16227* (2013.01); *H01L 2224/48091* (2013.01); *H01L 2224/48799* (2013.01); *H01L 2225/1023* (2013.01); *H01L 2225/1058* (2013.01); *H01L 2225/1082* (2013.01); *H01L 2924/14* (2013.01); *H01L 2924/15311* (2013.01); *H01L 2924/181* (2013.01); *H01L 2924/1815* (2013.01); *H01L 2924/19107* (2013.01); *H01L 2924/3511* (2013.01)
(58) Field of Classification Search
   USPC .................................................. 257/737, 358
   See application file for complete search history.

(56) References Cited

U.S. PATENT DOCUMENTS

2013/0075916 A1\*  3/2013  Choi ................. H01L 23/49811
                                                                257/773
2015/0364816 A1\*  12/2015  Murugan ................ H01L 23/66
                                                                343/905

FOREIGN PATENT DOCUMENTS

TW          201131735         9/2011
TW          201138056         11/2011

OTHER PUBLICATIONS

International Preliminary Report on Patentability for PCT Patent Application No. PCT/CN2015/098870 dated Jul. 5, 2018, 7 pgs.
Office Action from Taiwan Patent Application No. 105138633, dated Feb. 7, 2020, 9 pgs.

\* cited by examiner

US 10,756,072 B2

CONDUCTIVE WIRE THROUGH-MOLD CONNECTION APPARATUS AND METHOD

CROSS-REFERENCE TO RELATED APPLICATION

This patent application is a U.S. National Phase Application under 35 U.S.C. § 371 of International Application No. PCT/CN2015/098870, filed Dec. 25, 2015, entitled "CONDUCTIVE WIRE THROUGH-MOLD CONNECTION APPARATUS AND METHOD," which designates the United States of America, the entire disclosure of which is hereby incorporated by reference in its entirety and for all purposes.

FIELD

The field encompasses connections for package-on-package and system-in-package semiconductor packaging technologies. More particularly, the field pertains to tight pitch through-mold interconnects.

BACKGROUND

Package-on-package ("PoP") technology is widely used for electronics to provide increased functionality and further miniaturization typically demanded for consumer devices.

One major type of PoP technology uses a partial molded bottom package coupled to an upper package by using solder balls or bumps. One disadvantage of this design is the difficulty of controlling warpage of the bottom package. Another disadvantage of this design is that a relatively large solder ball is needed to achieve higher ball stand off, which consumes more surface area (i.e., x-y area). Thus, this design has a larger distance between conductive leads (the distance known as "pitch"), and this is not easily amenable to a fine pitch package—i.e., a package with relatively small distances between conductive leads.

Another major type of PoP technology uses a fully molded bottom package, which evolved from the partial molded package. The fully molded bottom package has less warpage and uses through-mold via ("TMV") connections. For this design, the through-mold via has a solder bump or ball at the bottom of the via of the bottom package. The upper package is connected by another solder ball that contacts the solder ball of bottom package.

A disadvantage of the fully molded package is the difficulty of obtaining a fine pitch for leads using through-mold via connections. To form a TMV, a cavity is formed in the molded epoxy of the bottom package using a laser drilling process. Unfortunately, laser drilling results in the via having a conical shape rather than a cylindrical shape. The conical via shape means that the pitch of the interconnects increases with the thickness of the epoxy mold cap. Moreover, for tight pitch designs, during processing the mold separation between vias may be removed, resulting in shorted solder balls. This may result in higher manufacturing costs for deeper through-mold via designs.

To avoid shorted (i.e., bridged) solder balls, a design using copper pillars or copper posts has been proposed. For that approach, the via does not extend all the way through the mold. Instead, a copper pillar or copper post is built up on the bottom substrate. This reduces the depth of the conically-shaped via in the mold because the via only needs to reach the top of the copper pillar or post. This helps to reduce the via pitch—i.e., the distance between vias. A disadvantage of the copper pillar or post design is that the cost of additive copper plating in very expensive. Moreover, the current state of the art for the industry would be a maximum height of 100 to 150 microns for the copper post.

BRIEF DESCRIPTION OF THE DRAWINGS

Features and advantages of embodiments will be apparent from the accompanying drawings, which provide illustration by way of example and not limitation, and in which like references indicate similar elements.

DETAILED DESCRIPTION

Low cost through-mold connection methods and apparatuses are described that are applicable for electrical and integrated circuit packaging technologies involving connections between package and circuit boards, including package-on-package ("PoP") and system-in-package ("SiP") technologies. The conductive wire through-mold connection methods and apparatuses help to achieve a fine pitch between solder connections, especially for packaging having deep mold caps.

Figure 1:
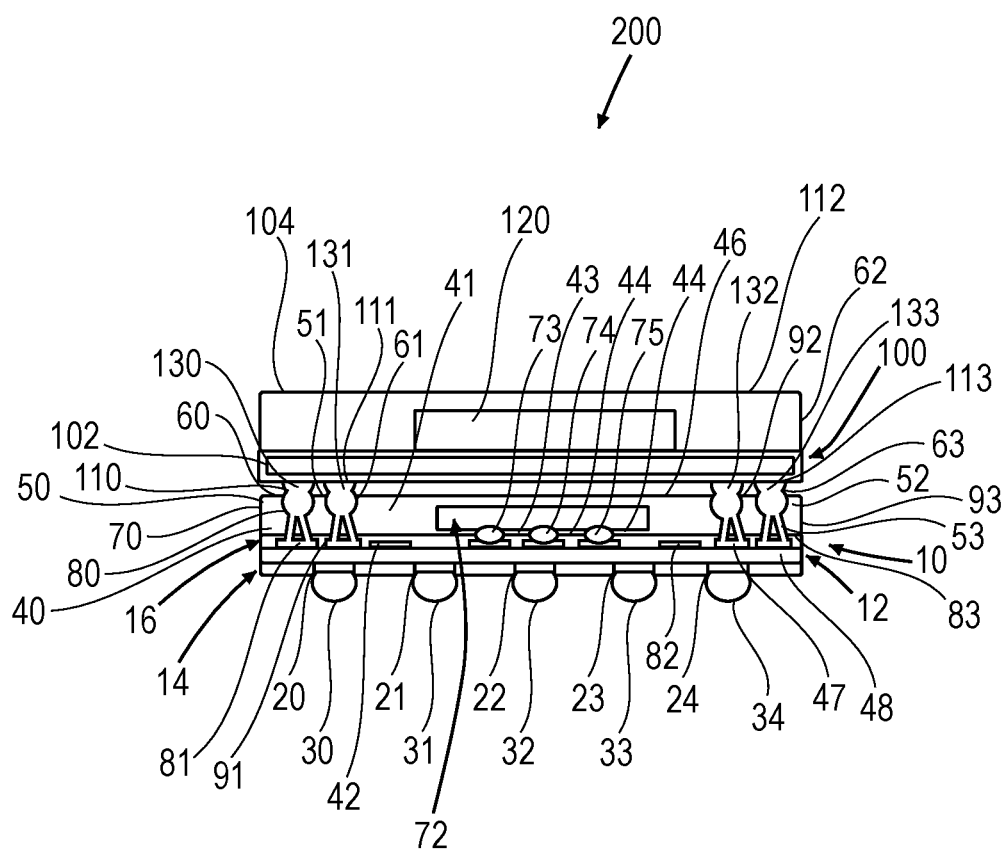
FIG. 1 illustrates a package-on-package ("PoP") design with a through-mold via ("TMV") plus a looped wire bond.

FIG. 1 illustrates a package-on-package ("PoP") structure 200 that includes a lower package 10 connected both electronically and physically to an upper package 100. Lower package 10 includes integrated circuit 72. Upper package 100 includes integrated circuit 120.

The lower package 10 includes a foundation layer 12, which is a substrate. Layer 14 resides below substrate 12 and includes conductive metallic pads 20 to 24. Solder balls 30 to 34 (also referred to as solder bumps 30-34) are attached to respective conductive metallic pads 20 to 24. Solder balls 30 to 34 provide electrical connections to package 200.

Layer 16 of lower package 10 resides above substrate 12 and includes conductive metal pads 40 to 48. Solder balls (or bumps) 73 to 75 connected to respective conductive metallic pads 43 to 45 provide electrical and physical connections to integrated circuit 72. Although not shown in FIG. 1, conductive interconnect lines within package 10 are coupled to metallic pads 40-48, and some of the interconnect lines may be coupled to integrated circuit 72.

A mold cap 70 resides on top of layer 16 and covers integrated circuit 72. For one embodiment, mold cap 70 is made of epoxy with filler material. For one embodiment, the filler is approximately 8% of the mold cap 70. For certain embodiments, mold cap 70 can range from 700 microns to 1,000 microns in height. For other embodiments, other heights are possible for mold cap 70.

Conductive looped upright wires 50 to 53 are wirebonded to respective conductive metallic pads 40, 41, 47, and 48. For one embodiment, each of pads 40, 41, 47, and 48 is approximately 550 microns wide. For other embodiments, other dimensions are possible. For one embodiment, the looped upright wires 50-53 are made of copper. The looped wires 50-53 are surrounded on the sides by the mold cap 70.

For the embodiment shown in FIG. 1, the two bottom ends of each loop of wire are connected to a single conductive metallic pad. For example, the bottom ends of looped wire 50 are bonded to conductive metallic pad 40. In a similar way, each pair of bottom ends of looped wires 51, 52, and 53 is bonded to respective metallic pads 41, 47, and 48.

Solder balls (or bumps) 80 to 83 are attached to the respective top portions of respective looped wires 50 to 53. Solder balls 80 to 83 reside in respective through-mold vias 90 to 93. For one embodiment, each of solder balls 80 to 83 is approximately 470 microns in diameter. For other embodiments, other sizes are possible.

Each of the through-mold vias 90 to 93 does not extend completely through the mold cap 70. Instead, each of the through-mold vias 90 to 93 reaches or extends partially through mold cap 70. The vias 90 to 93 extend to the respective tops of respective upright looped wires 50 to 53.

The solder balls (or bumps) 110 to 113 of upper package 100 are attached to respective solder balls (or bumps) 80 to 83. Solder balls 110 to 113 serve as connectors for upper package 100. Solder balls 110 to 113 are attached to respective conductive metallic pads 130 to 133 of upper package 100.

Upper package 100 includes a foundation layer 102, which is a substrate. Upper package 100 also includes an integrated circuit 120. A mold cap 104 resides on top of upper package 100 and surrounds the sides and top of the integrated circuit 120. Although not shown in FIG. 1, conductive interconnect lines couple conductive metallic pads 130-133 to integrated circuit 120.

For alternative embodiments, various electrical components and semiconductors could reside in upper package 100.

The upright wire loops 50 to 53, solder balls 80 to 83, and solder balls 110 to 113 provide electrical interconnections and physical couplings between lower package 10 and upper package 100 of PoP 200.

The use of upright wire loops 50 to 53, partial through-mold vias 90 to 93, and solder balls 80 to 83 permits a tighter or finer pitch between package contacts, which helps to facilitate and maximize the miniaturization of packaging of integrated circuits and electrical components. For certain embodiments, examples of the finer pitches are 1.00 millimeters and 0.80 millimeters. For other embodiments, other pitches are possible.

Finer pitch is achieved because of the reduced height of vias 90 to 93. Through-mold vias tend to have conical shapes, rather than cylindrical shapes, with the larger openings at the tops of the vias. The deeper the through-mold via, the larger the top of the conical shape. Larger conical openings of vias means that solder balls need to be placed farther apart. By having vias 90 to 93 of reduced depth, the embodiment of FIG. 1 permits solder balls 80 and 81 to be closer together without shorting. The same applies to solder balls 82 and 83.

Avoiding the shorting of solder balls 80-83 also helps to increase the yield of the fabrication of lower package 10. This in turn helps to reduce overall fabrication costs of PoP package 200.

Figure 2:
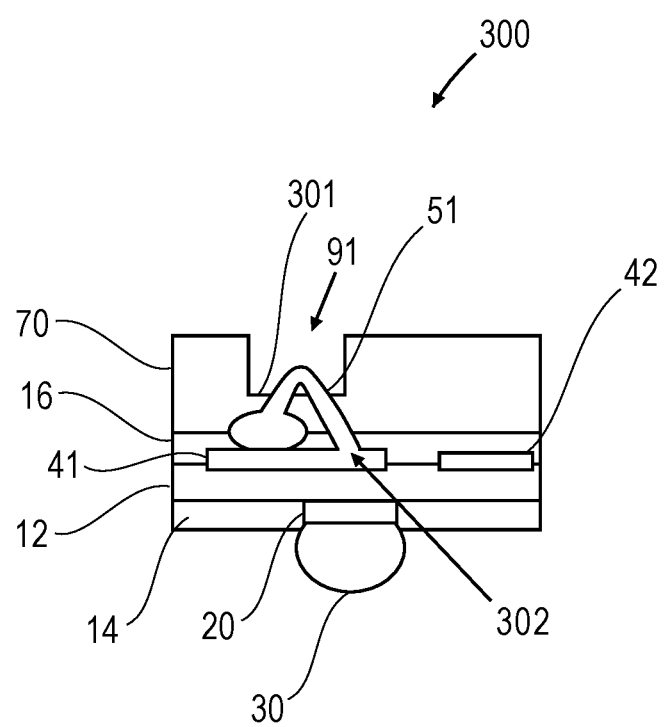
FIG. 2 shows an embodiment with a relatively thin mold cavity, wherein the copper wire can be loop bonded on a single ball pad.

FIG. 2 shows portion 300 of lower package 100 of FIG. 1 to provide a more detailed view. Layer 16 containing conductive metallic pads 41 and 42 resides above substrate 12. Layer 14 containing conductive metallic pad 20 resides below substrate 12. Solder bump (or ball) 30 is attached to conductive metallic pad 20.

Upright conductive looped wire 51 is wirebonded to conductive metallic pad 41. The attachment point 301 contains a bump (ball) bond between wire loop 51 and conductive pad 41. The other end 302 of looped wire 51 is attached to conductive metallic pad 41 using a stitch bond like a crescent.

For one embodiment, the wire of looped wire 51 is copper wire that is approximately 20 microns in thickness. For certain embodiments, the looped wire 51 ranges from 400 microns to 500 microns in height. For other embodiments, other heights are possible.

FIG. 2 depicts through-mold via 91 without the solder ball (or bump) 81 of FIG. 1 being shown. As shown in FIG. 2, the through-mold via 91 does not extend entirely through mold cap 70. Instead, via 91 extends down to the upper portion of wire loop 51. For one embodiment, a portion of wire loop 51 resides in via 91. That upper portion of wire loop 51 in via 91 provides a point of attachment and connection to solder ball 81 of FIG. 1. For one embodiment, the bottom of via 91 extends to the top of wire loop 51, with the top of wire loop 51 exposed as an attachment point for solder ball 81 of FIG. 1.

Figure 3:
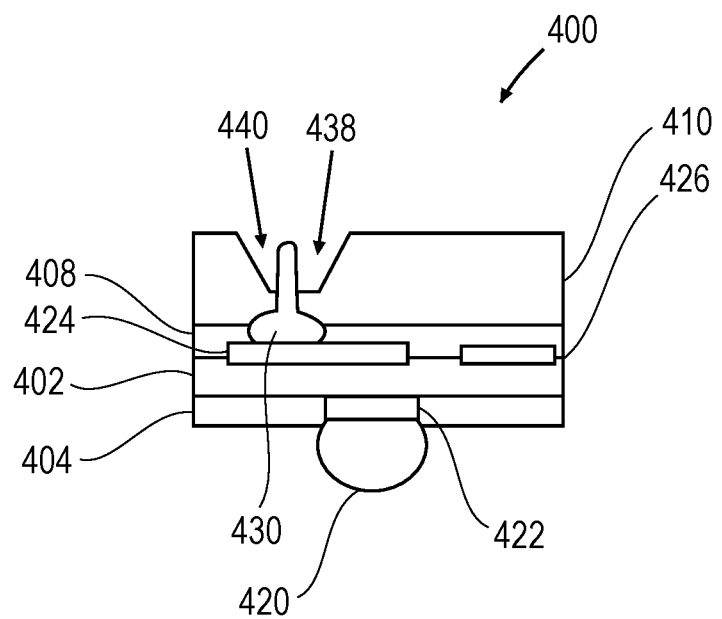
FIG. 3 illustrates a through-mold via plus a vertical wire bond.

FIG. 3 illustrates an embodiment with a vertical wire bond 438 rather than a looped wire. FIG. 3 illustrates a portion 400 of a lower package (not shown) that is part of a package-on-package (not shown). Portion 400 includes a foundation layer 402, which is a substrate. Layer 408 is above substrate 402 and layer 404 is below substrate 402. Layer 408 includes conductive metallic pads 424 and 426. Layer 404 includes conductive metallic pad 422.

Vertical wire 438 is bonded to conductive metallic pad 424 with ball bond 430 for one embodiment. For one embodiment, vertical wire 438 extends from conductive pad 424 into the partial through-mold via 440. For another embodiment, the top of vertical wire 438 extends to the bottom of via 440.

Mold cap 410 resides above layer 408 and surrounds the sides of vertical wire 438. For one embodiment, mold cap 410 is made of epoxy and filler. The mold cap 410 further covers an integrated circuit (not shown).

The via 440 extends only partially through mold cap 410. In a subsequent processing step, a solder ball or bump (not shown) would be placed in via 440 and attached to the top of vertical wire 438.

The vertical wire 438 of FIG. 3 is advantageous given that it uses less material than the upright wire loop 51 of FIG. 2. The vertical wire 438 of FIG. 3 is also more easily formed for a deep (high) mold cap 410 while retaining a relatively small conductive metallic pad 424.

Figure 4:
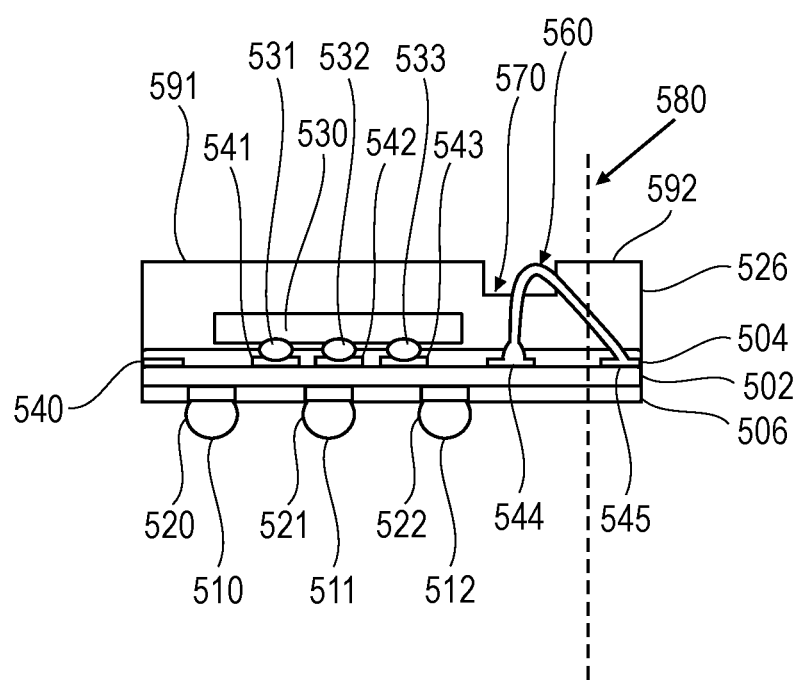
FIG. 4 illustrates copper wire bonded onto two conductive pads, with the second pad being beyond the edge of the final package.

FIG. 4 illustrates another embodiment of a vertical wire design. FIG. 4 shows a packaging structure 500 with a relatively high loop of wire 570 with ends attached to conductive metallic pads 544 and 545.

For one embodiment, wire loop 570 can be as tall as 1 millimeter. For other embodiments, other heights of wire loop 570 are possible.

The packaging structure 500 of FIG. 4 has a substrate 502 acting as a foundation layer. Layer 504 resides above substrate 502 and layer 506 resides below substrate 502. Layer 506 has conductive metal pads 520 to 522. Layer 504 has conductive metal pads 540 to 545. Solder balls (or bumps) 510 to 512 are attached to respective conductive metallic pads 520 to 522.

A mold cap 526 resides above layer 504. Integrated circuit 530 resides within mold cap 526. Solder balls (or bumps) 531 to 533 of integrated circuit 530 are attached to respective conductive metallic pads 541 to 543.

As shown in FIG. 4, an upper portion of wire loop 560 resides within a partial through-mold via 570 of mold cap 526.

For the embodiment of FIG. 4, the package structure 500 is cut at line 580 as part of the fabrication process. The portion of structure 500 to the left of line 580 becomes package 591. The portion 592 to the right of line 580 is removed and is not part of the package 591.

Although not shown in FIG. 4, a solder ball (or bump) is then attached to wire 570 in package 591, and the solder ball resides in via 570.

Figure 5:
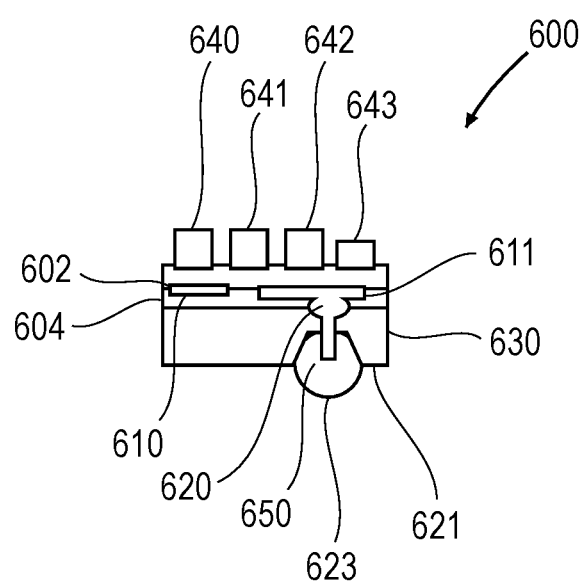
FIG. 5 illustrates a vertical wire bond used in a system-in-a-package design with a thick epoxy mold cap.

FIG. 5 illustrates a vertical wire interconnect 620 in a system-in-package 600. System-in-package 600 includes a substrate 602, which is a foundation layer, upon which electrical components 640 to 643 are mounted. Conductive metallic pads 610 and 611 reside on the underside of substrate 602 in layer 604.

A thick mold cap 630 made of epoxy with filler is attached to layer 604. Mold cap 630 has a partial through-mold via 650.

Vertical conductive wire 620 is wirebonded to conductive metallic pad 611 with a ball bond 621. Solder ball (or bump) 623 is attached to vertical wire 620.

Figure 6:
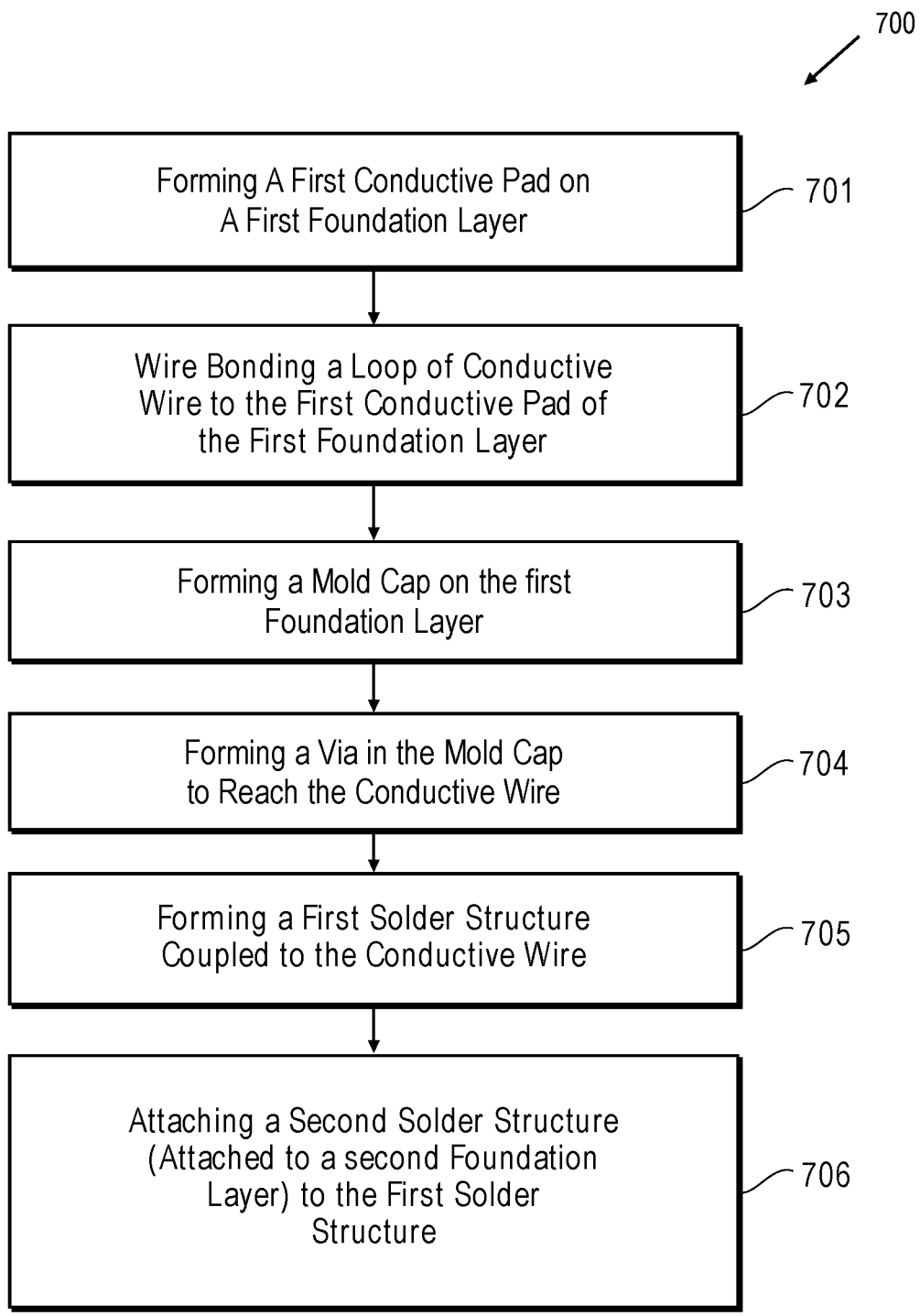
FIG. 6 is a flow chart for forming a packaging structure with a mold cap and a looped conductive wire.

FIG. 6 is a flow chart 700 of a method for fabricating a package-on-package assembly having a conductive wire loop interconnect.

Figure 7:
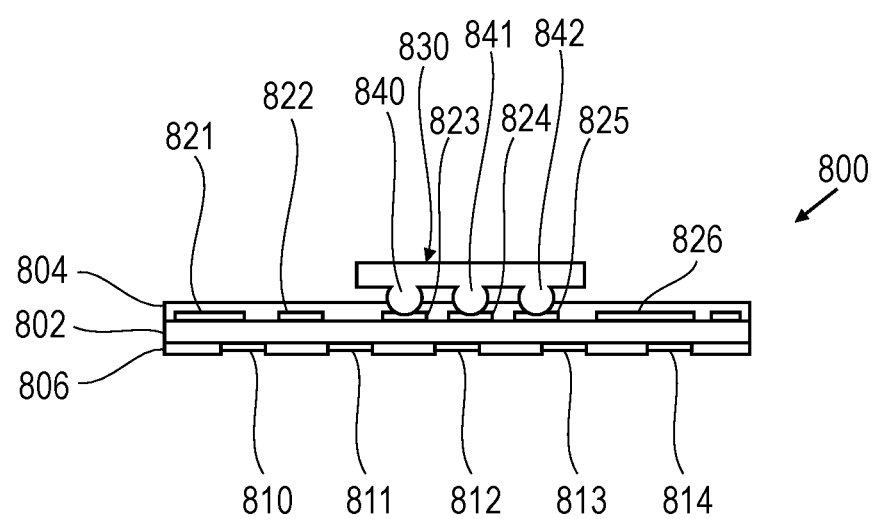
FIG. 7 illustrates a fabrication stage for a bottom flip chip ("FC") package or a package using surface mount technology ("SMT").

At operation 701 of process 700, a first conductive pad is formed on a first foundation layer. Operation 701 of FIG. 6 is illustrated in FIG. 7, which shows upper conductive metallic pads 821 to 826 formed on the top of substrate 802, which is a foundation layer. Conductive pads 821 to 826 reside in layer 804.

FIG. 7 also shows underside conductive metallic pads 810 to 814 attached to substrate 802 and part of layer 806. An integrated circuit 830 is attached to substrate 802 via solder balls (or bumps) 840 to 842, which are attached to respective conductive metallic pads 823 to 825.

For one embodiment, assembly 800 of FIG. 7 will be a bottom flip chip ("FC") package that is part of a package-on-package assembly. For another embodiment, assembly 800 will be a bottom surface mount technology ("SMT") package that is part of a package-on-package assembly.

Figure 8:
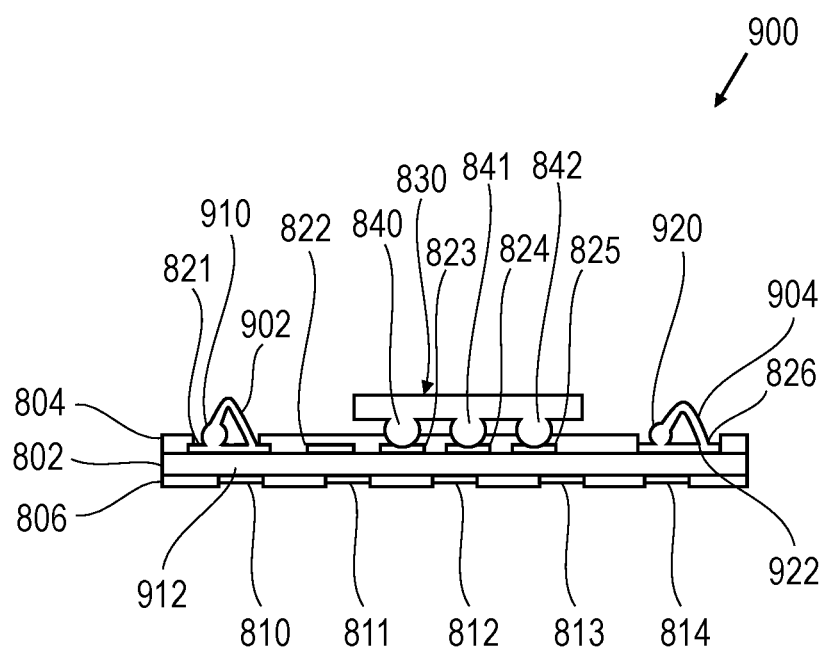
FIG. 8 illustrates a fabrication stage with each wire loop on a respective single conductive pad for a relatively shallow mold cap.

At operation 702 of process 700 of FIG. 6, a loop of conductive wire is wirebonded to a first conductive pad of the first foundation layer. Operation 702 of FIG. 6 is illustrated in FIG. 8, which shows assembly 900 with conductive wire loops 902 and 904 made of copper wire. For other embodiments, other types of wire are used to form the wire loops 902 and 904, which are also referred to as wire sticks 902 and 904.

Wire loop 902 is wirebonded to conductive metallic pad 821. For one embodiment, ball (bump) bonding is used to form ball bond 910. For one embodiment, a stitch bond is used at end 912 of wire loop 902. For other embodiments, other types of wirebonding are used, including wedge bonding and compliant bonding. For yet other embodiments, other methods of attaching wire loop 902 to conductive metallic pad 821 are used.

In a similar fashion, copper wire loop 904 is wirebonded to conductive metallic pad 826. For one embodiment, ball bonding is used and results in ball bond 920. Stitch bonding is used at end 922 of wire loop 904. For other embodiments, other methods are used to attach wire loop 904.

Figure 9:
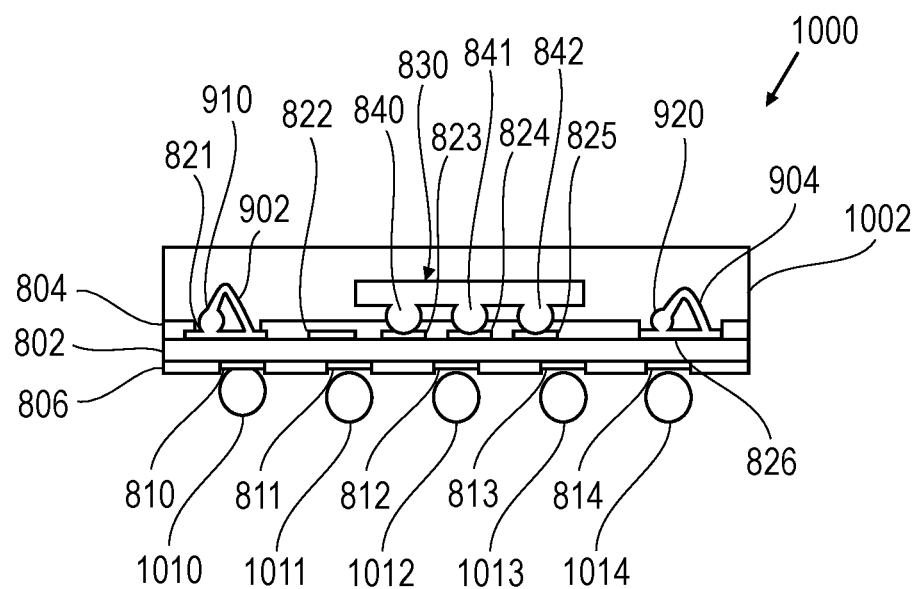
FIG. 9 shows the molding fabrication stage for a shallow mold cap.

At operation 703 of process 700 of FIG. 6, a mold cap is formed on the first foundation layer. Operation 703 of FIG. 6 is illustrated in FIG. 9, which shows assembly 1000 with mold cap 1002. Mold cap 1002 is formed above layer 804. Mold cap 1002 covers integrated circuit 830 and wire loops 902 and 904. For one embodiment, mold cap 1002 is made of epoxy and a filler material. For one embodiment, the filler material comprises approximately 8% of the mold 1002. Mold cap 1002 helps to protect integrated circuit 803 from corrosion and damage.

As part of the fabrication process, various soldering techniques, including reflow soldering, can be used to attach solder balls (or bumps) 1010-1014 to respective conductive metallic pads 810-814. For other embodiments, solder balls 810-814 can be attached at other stages of the fabrication process.

Figure 10:
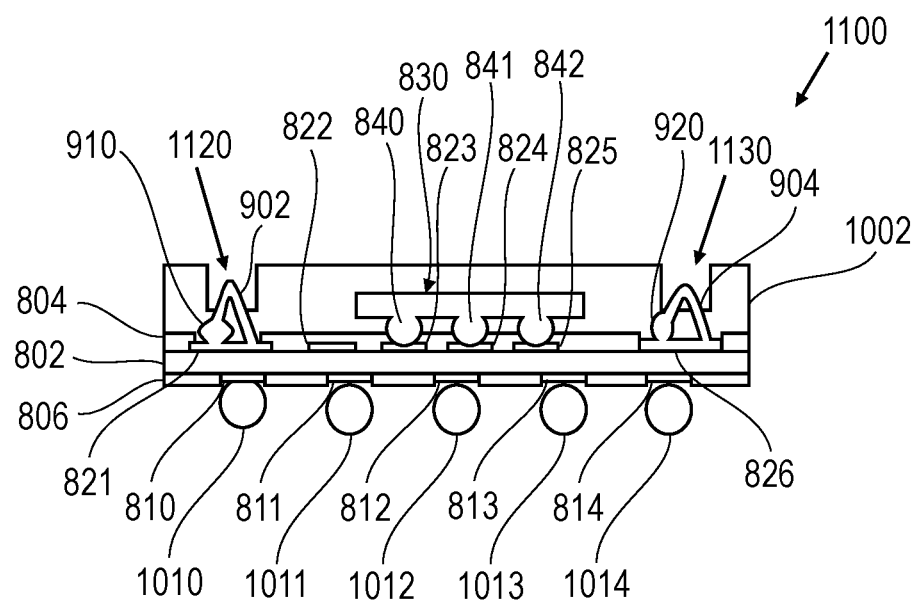
FIG. 10 illustrates through-mold vias formed by laser drilling.

At operation 704 of process 700 of FIG. 6, a via is formed in the mold cap to reach the conductive wire. Operation 704 of FIG. 6 is illustrated in FIG. 10, which shows assembly 1100 with a mold cap 1002 containing vias 1120 and 1130. Each of vias 1120 and 1130 is formed in mold cap 1002 as a partial through-mold via. Via 1120 reaches and exposes a portion of conductive wire loop 902. Via 1130 reaches and exposes a portion of conductive wire loop 904.

For one embodiment, laser drilling is used to form each of vias 1120 and 1130. For another embodiment, strip grinding of mold cap 1002 is done before using laser drilling to form each of vias 1120 and 1130.

Figure 11:
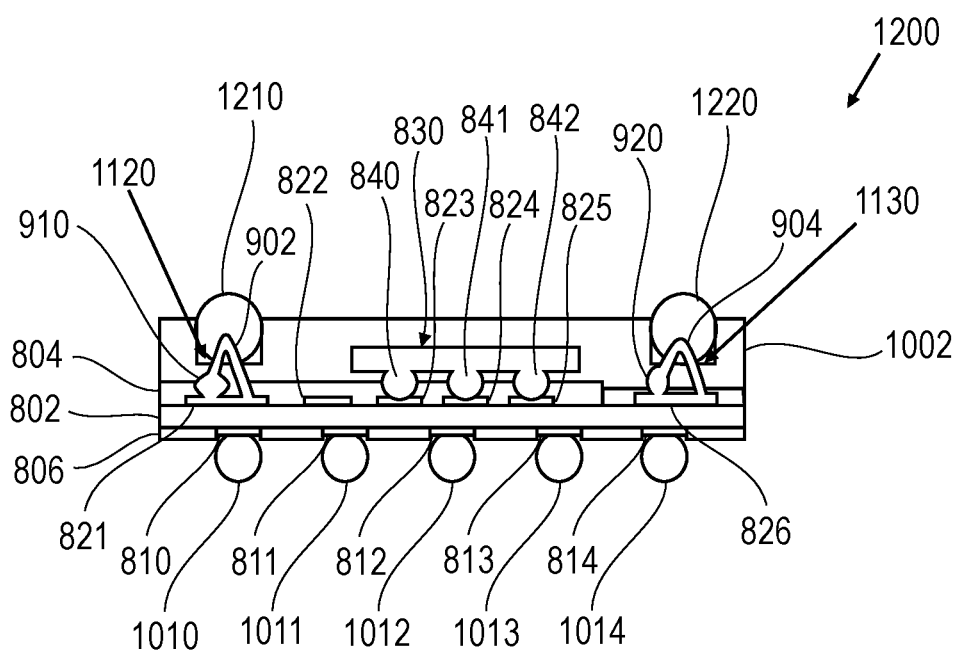
FIG. 11 shows solder ball formation for a relatively shallow mold cap.

At generation 705 of process 700 of FIG. 6, a first solder structure is coupled to the conductive wire. Operation 705 is illustrated in FIG. 11, which shows assembly 1200. Solder ball (or bump) 1210 is placed in via 1120 of mold cap 1002 and attached to conductive wire loop 902. Solder ball 1220 (or bump) is placed in via 1130 of mold cap 1002 and attached to conductive wire loop 904. Attachment of solder balls 1210 and 1220 may be by various soldering techniques, including reflow soldering.

Figure 12:
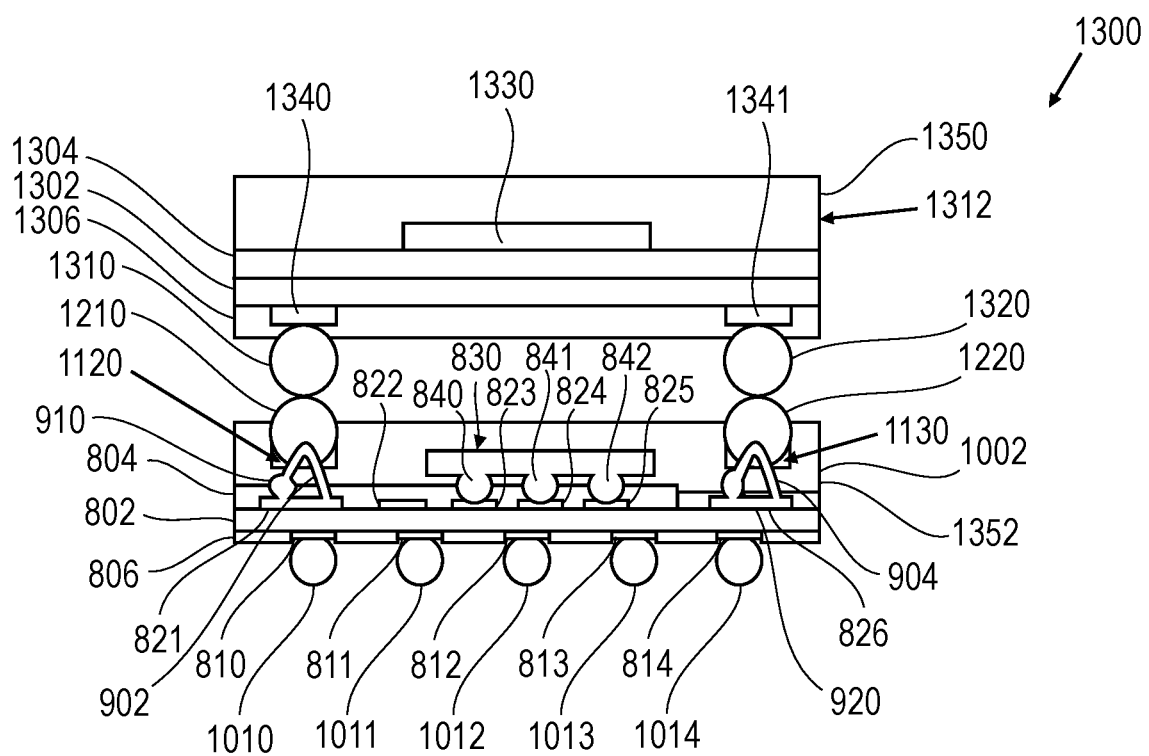
FIG. 12 illustrates package-on-package formation with each looped wire contacting a respective conductive metallic pad.

At operation 706 of process of 700 of FIG. 6, a second solder structure—which is attached to a second foundation layer—is attached to the first solder structure. Operation 706 of FIG. 6 is illustrated in FIG. 12, which shows package-on-package assembly 1300, which is made up of upper package 1350 attached to lower package 1352. The attachment between packages 1350 and 1352 is accomplished by attaching solder balls (or bumps) 1310 and 1320 to respective solder balls (or bumps) 1210 and 1220. The attachment can be done using various soldering techniques, including reflow soldering.

Solder balls (or bumps) 1310 and 1320 are attached to respective conductive metallic pads 1340 and 1341, which are part of layer 1306 and attached to the underside of foundation layer 1302, which for one embodiment is substrate 1302.

Package 1350 is also made up of a layer 1304 attached to substrate 1302. Integrated circuit 1330 is coupled to layer 1304. Mold cap 1312 covers integrated circuit 1330 and resides above layer 1304.

Figure 13:
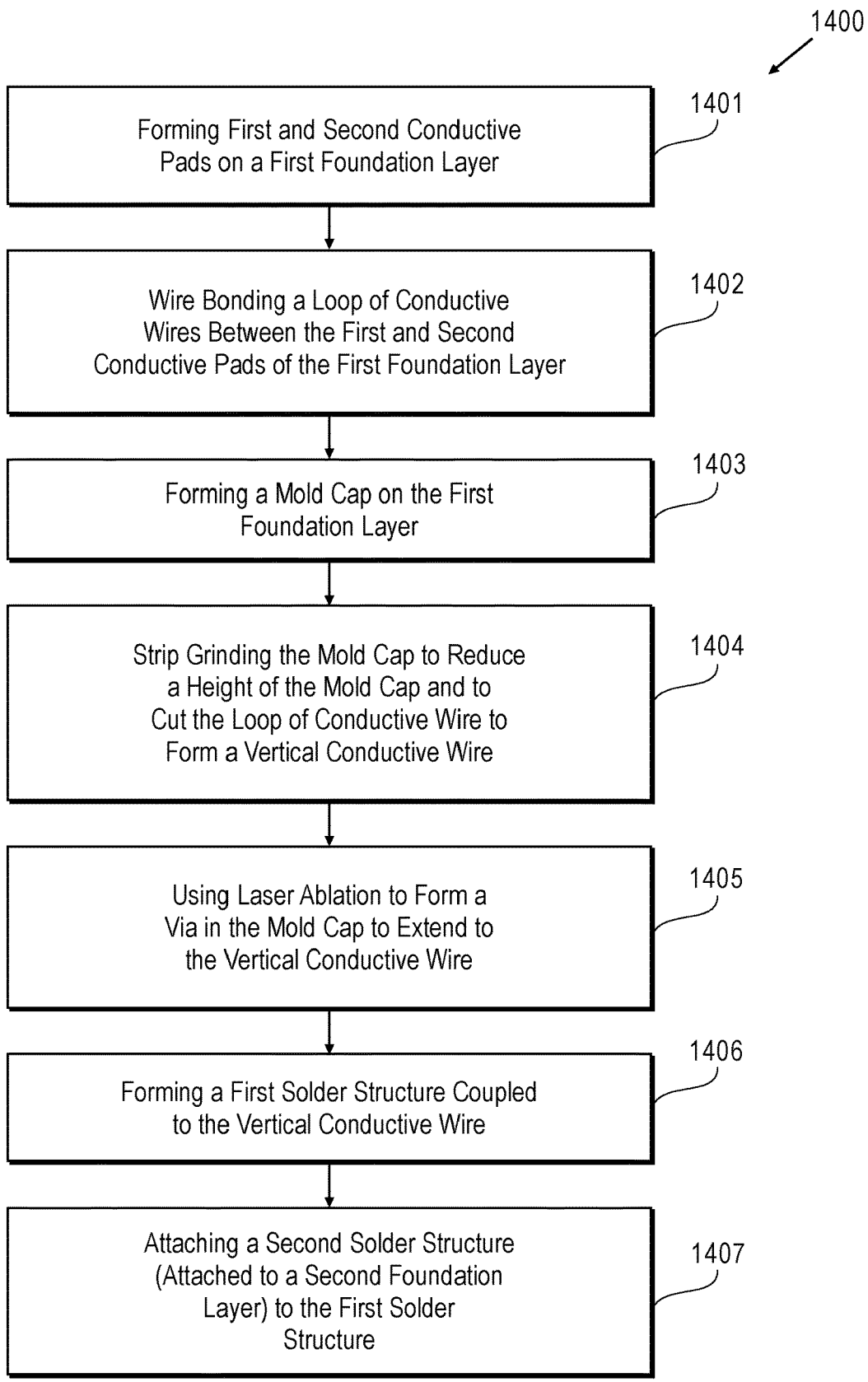
FIG. 13 is a flow chart for forming a packaging structure with a deep mold cap and a vertical conductive wire.

FIG. 13 is a flow chart 1400 of a method for fabricating a package-on-package assembly having a conductive vertical wire interconnect.

Figure 14:
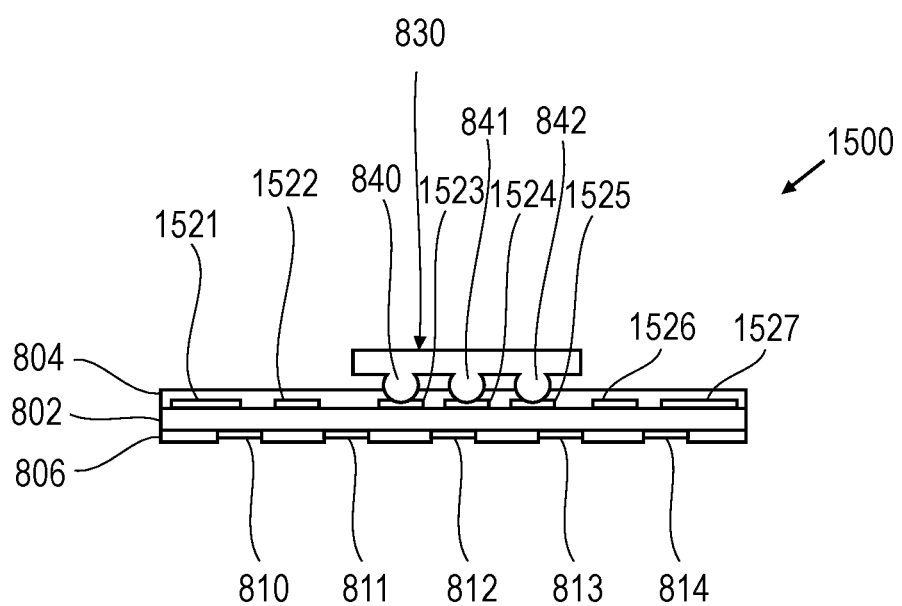
FIG. 14 shows a fabrication stage with conductive metal pads.

At operation 1401 of process 1400, first and second conductive pads are formed on a first foundation layer. Operation 1401 of FIG. 13 is illustrated in FIG. 14, which shows upper conductive metallic pads 1521 to 1527 formed on the top of substrate 802, which is a foundation layer. Conductive pads 1521 to 1527 reside in layer 804.

FIG. 14 also shows underside conductive metallic pads 810 to 814 attached to substrate 802 and part of layer 806. Integrated circuit 830 is attached to substrate 802 via solder balls (or bumps) 840 to 842, which are attached to respective conductive metallic pads 1523 to 1525.

For one embodiment, assembly 1500 of FIG. 14 will be a bottom flip chip ("FC") package that is part of a package-on-package assembly. For another embodiment, assembly 1500 will be a bottom surface mount technology ("SMT") package that is part of package-on-package assembly.

Figure 15:
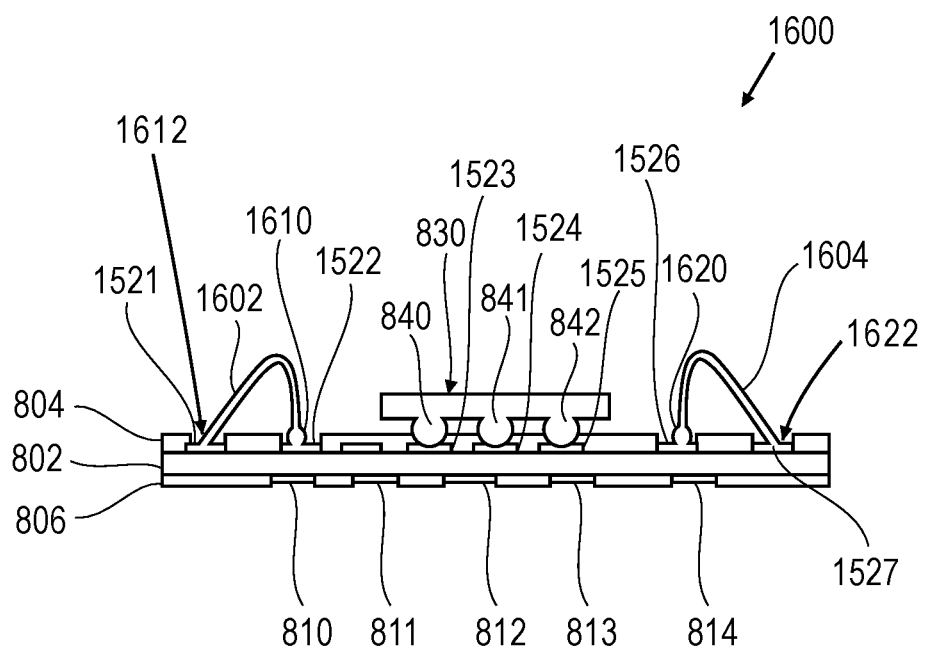
FIG. 15 shows a fabrication stage with each relatively high wire loop connected between a respective main conductive pad and a respective auxiliary pad for a deep mold cap.

At operation 1402 of process 1400 of FIG. 13, a loop of conductive wire is wire bonded between first and second conductive pads of the first foundation layer. Operation 1402 of FIG. 13 is illustrated in FIG. 15, which shows assembly 1600 with relatively tall (high) conductive wire loops 1602 and 1604 made of copper wire. For other embodiments, other types of wire are used to form wire loops 1602 and 1604, which are also referred to as wire sticks 1602 and 1604.

Wire loop 1602 is wirebonded between conductive metallic pad 1522 and conductive metallic pad 1521. For one embodiment, ball bonding is the type of wire bonding used to form ball bond 1610 with pad 1522. For one embodiment, end 1612 of wire loop 1602 is stitch bonded to metallic pad 1521. For other embodiments, other types of wirebonding are used, including wedge bonding and compliant bonding. For yet other embodiments, other methods of attaching wire loop 1602 to conductive metal pads 1521 and 1522 are used.

In a similar fashion, tall copper wire loop 1604 is wirebonded between conductive metallic pad 1526 and conductive metallic pad 1527. For one embodiment, ball bonding is used to form ball bond 1620 with pad 1526. For one embodiment, end 1622 of wire loop 1604 is stitch bonded to metallic pad 1527. For other embodiments, other methods of attaching wire loop 1602 are used.

Figure 16:
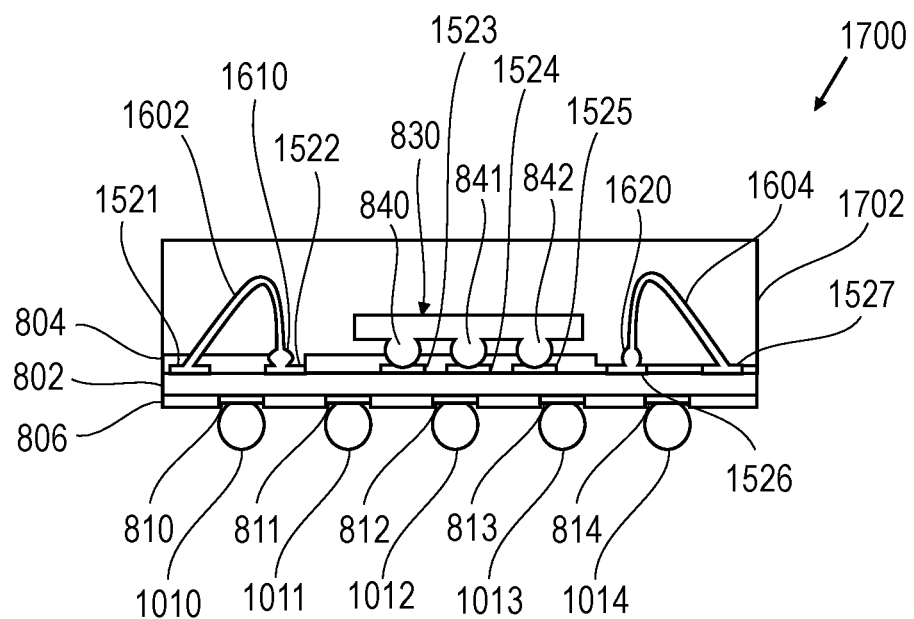
FIG. 16 shows the fabrication stage for a deep or thick mold cap.

At operation 1403 of process 1400 of FIG. 13, a mold cap is formed on the first foundation layer. Operation 1403 of FIG. 13 is illustrated in FIG. 16, which shows assembly 1700 with mold cap 1702. Mold cap 1702 is formed above layer 804. Mold cap 1702 covers integrated circuit 830 and wire loops 1602 and 1604. For one embodiment, mold cap 1702 is made of epoxy and a filler material. Mold cap 1702 helps to protect integrated circuit 830 from corrosion and damage.

As part of the fabrication process, various soldering techniques including reflow soldering, can be used to attach solder balls (or bumps) 1010-1014 to respective conductive metallic pads 810-814. For other embodiments, solder balls 810-814 can be attached at other stages of the fabrication process.

Figure 17:
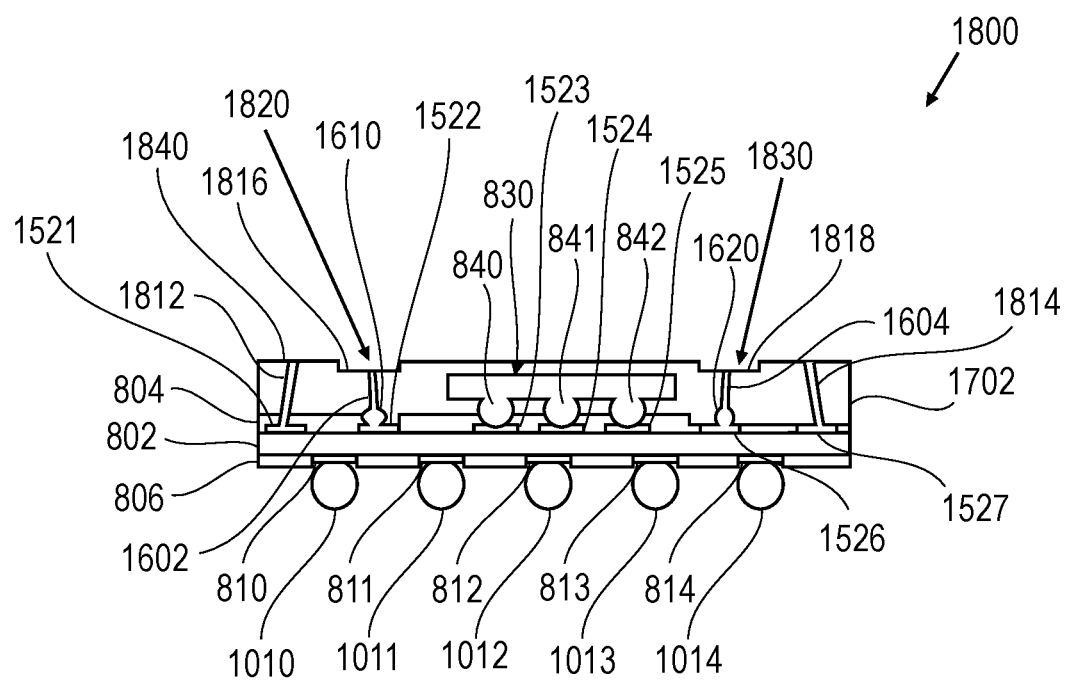
FIG. 17 shows the formation of vertical copper wires by strip grinding and laser ablation.

At operation 1404 of process 1400 of FIG. 13, strip grinding of the mold cap is done to reduce a height of the mold cap and to cut the loop of conductive wire to form a vertical conductive wire. Operation 1404 of FIG. 13 is illustrated in FIG. 17, which shows assembly 1800 with a mold cap 1702, with a reduced height due to strip grinding the top surface 1840 of mold cap 1702.

The strip grinding of mold cap 1702 results in wire loop 1602 being cut into separate sections 1812 and 1816, with a portion cut away. Separate section 1816 is a substantially vertical wire with a ball bond 1610 attached to conductive metallic pad 1522.

The strip grinding of mold cap 1702 also results in wire loop 1604 being cut into separate sections 1814 and 1818, with a portion cut away. Separate section 1818 is a substantially vertical wire with a ball bond 1620 attached to a conductive metallic pad 1526.

At operation 1405 of process 1400 of FIG. 13, laser ablation is used to form a via in the mold cap to extend to the vertical conductive wire. Operation 1405 of FIG. 13 is illustrated in FIG. 17, which shows mold cap 1702 containing vias 1820 and 1830. Each of vias 1820 and 1830 is formed in mold cap 1702 as a partial through-mold via. Via 1820 reaches and exposes a top of vertical conductive wire 1816. Via 1830 reaches and exposes a top of vertical conductive wire 1818.

For one embodiment, laser ablation is used to form each of vias 1820 and 1830, which results in relatively shallow vias. For another embodiment, laser drilling is used to form vias 1820 and 1830, which results in deeper vias.

Figure 18:
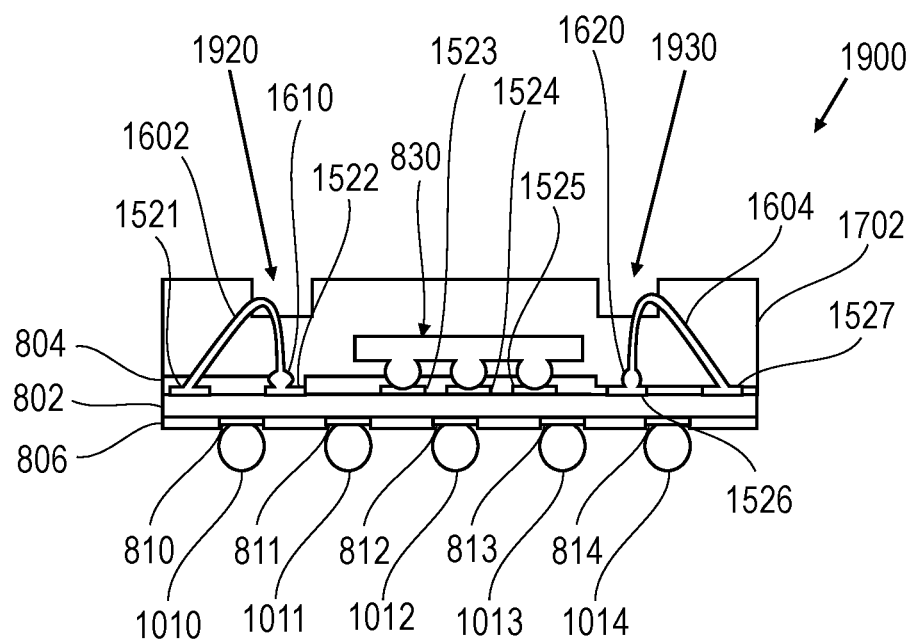
FIG. 18 shows through-mold vias formed by strip grinding to expose the copper wires.

FIG. 18 illustrates an alternative embodiment, wherein tall copper wire loops 1602 and 1604 are not cut. This embodiment is especially suited for thick mold caps and tall copper wire loops. For the assembly 1900, strip grinding is first used to reduce the overall height of mold cap 1702 without cutting wire loops 1602 and 1604. Then laser drilling is used to form vias 1920 and 1930 in mold cap 1702. Each of vias 1920 and 1930 is a partial through-mold via. For an alternative embodiment, laser ablation is used to form vias 1920 and 1930, which results in shallower vias.

Figure 19:
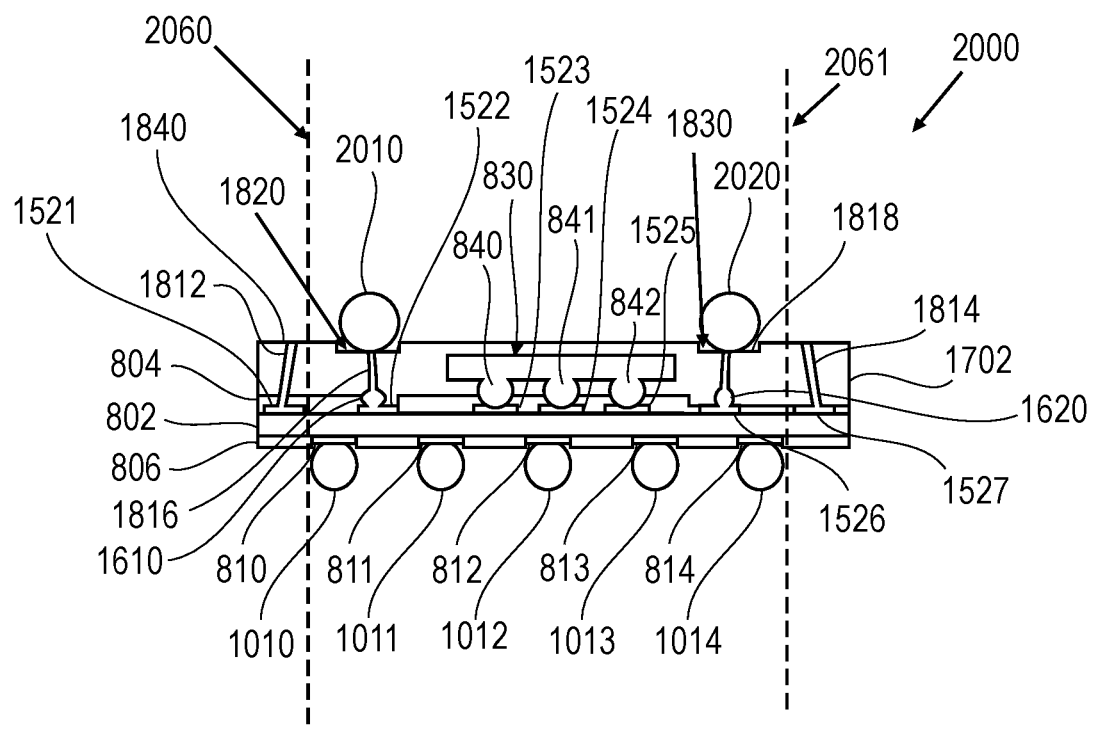
FIG. 19 shows solder ball formation for vertical copper wires.

At operation 1406 of process 1400, a first solder structure is coupled to the vertical conductive wire. Operator 1406 is illustrated in FIG. 19, which shows assembly 2000. Solder ball (or bump) 2010 is placed in via 1820 of mold cap 1702 and attached to conductive vertical wire 1816. Solder ball (or bump) 2020 is placed in via 1830 of mold cap 1702 and attached to conductive vertical wire 1818. Attachment of solder balls 2010 and 2020 may be by various soldering techniques, including reflow soldering.

For one embodiment, assembly 2000 is cut along lines 2060 and 2061 to remove the sections of assembly 2000 containing sections 1812 and 1814 of wire. For another embodiment, assembly is not cut and sections 1812 and 1814 of wire are not removed.

Figure 20:
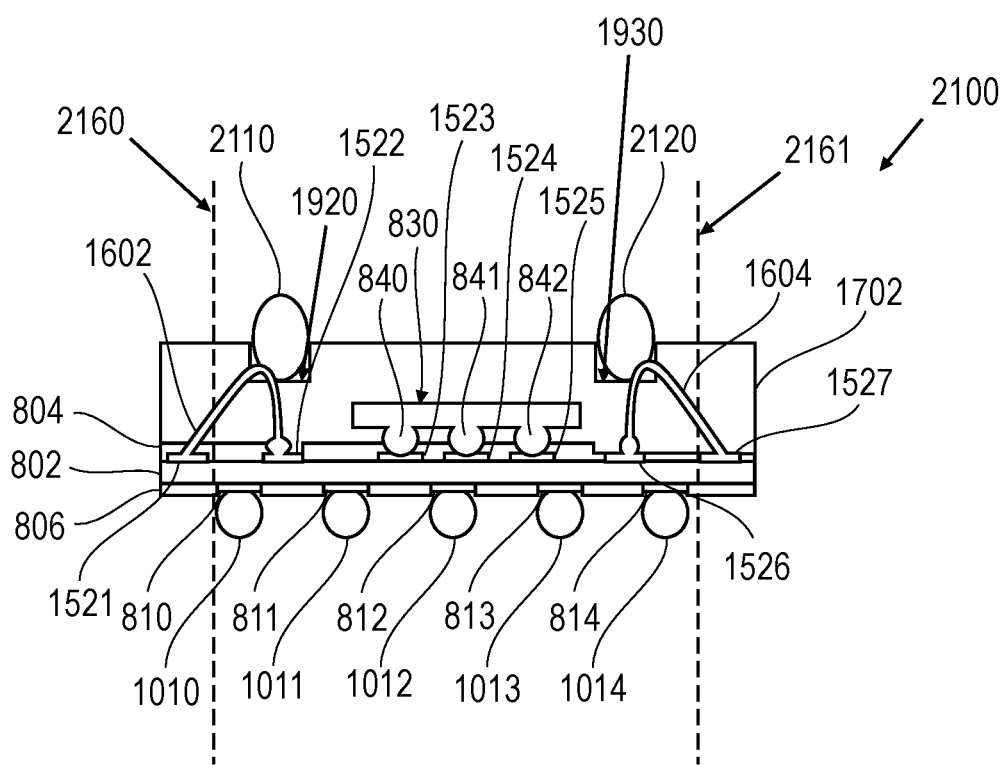
FIG. 20 shows solder ball formation for a relatively deep mold loop and looped wires looping between two respective conductive metallic pads.

FIG. 20 shows an alternative embodiment, wherein solder ball (or bump) 2110 is placed in via 1920 of mold cap 1702 of assembly 2100 and attached to tall conductive wire loop 1602. Solder ball (or bump) 2120 is placed in via 1930 of mold cap 1702 and attached to tall conductive wire loop 1604. Attachment of solder balls 2110 and 2120 may be by various soldering techniques, including reflow soldering.

For one embodiment, assembly 2100 is cut along lines 2160 and 2161 to (1) cut respective wire loops 1602 and 1604 and (2) remove end portions of assembly 2100. For another embodiment, assembly 2100 is not cut, and wire loops 1602 and 1604 are not cut.

Figure 21:
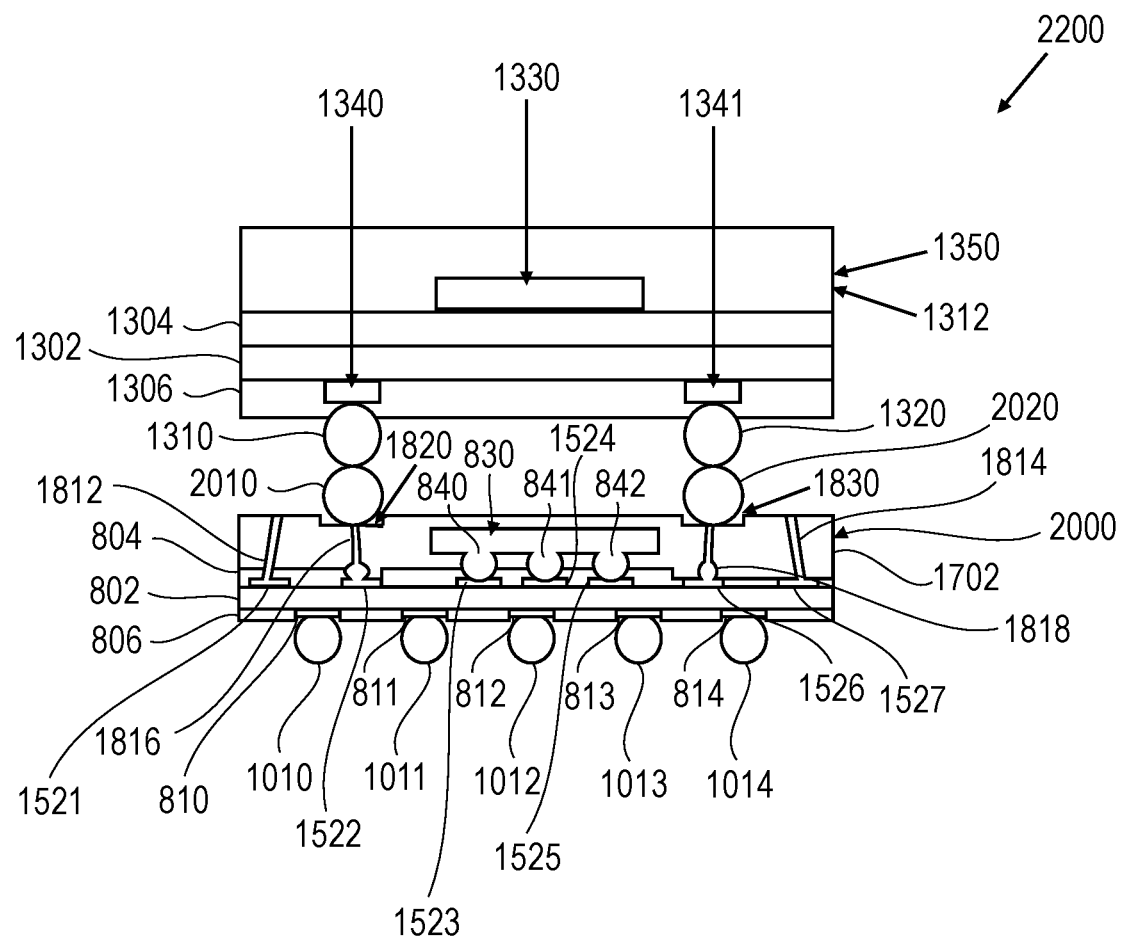
FIG. 21 illustrates the formation of a package-on-package with vertical wires and a relatively shallow mold cap.

At operation 1407 of process 1400 of FIG. 13, a second solder structure—which is attached to a second foundation layer—is attached to the first solder structure. Operation 1407 of FIG. 13 is illustrated in FIG. 21, which shows package-on-package assembly 2200, which is made up of upper package 1350 attached to lower package 2000. The attachment between packages 1350 and 2000 is accomplished by attached solder balls (or bumps) 1310 and 1320 to respective solder balls (or bumps) 2010 and 2020. The attachment can be done using various soldering techniques, including reflow soldering.

Solder balls (or bumps) 1310 and 1320 are attached to respective conductive metallic pads 1340 and 1341, which are part of layer 1306 and attached to the underside of foundation layer 1302, which for one embodiment is substrate 1302.

Package 1350 is also made up of a layer 1304 attached to substrate 1302. Integrated circuit 1330 is coupled to layer 1304. Mold cap 1312 covers integrated circuit 1330 and resides above layer 1304.

Figure 22:
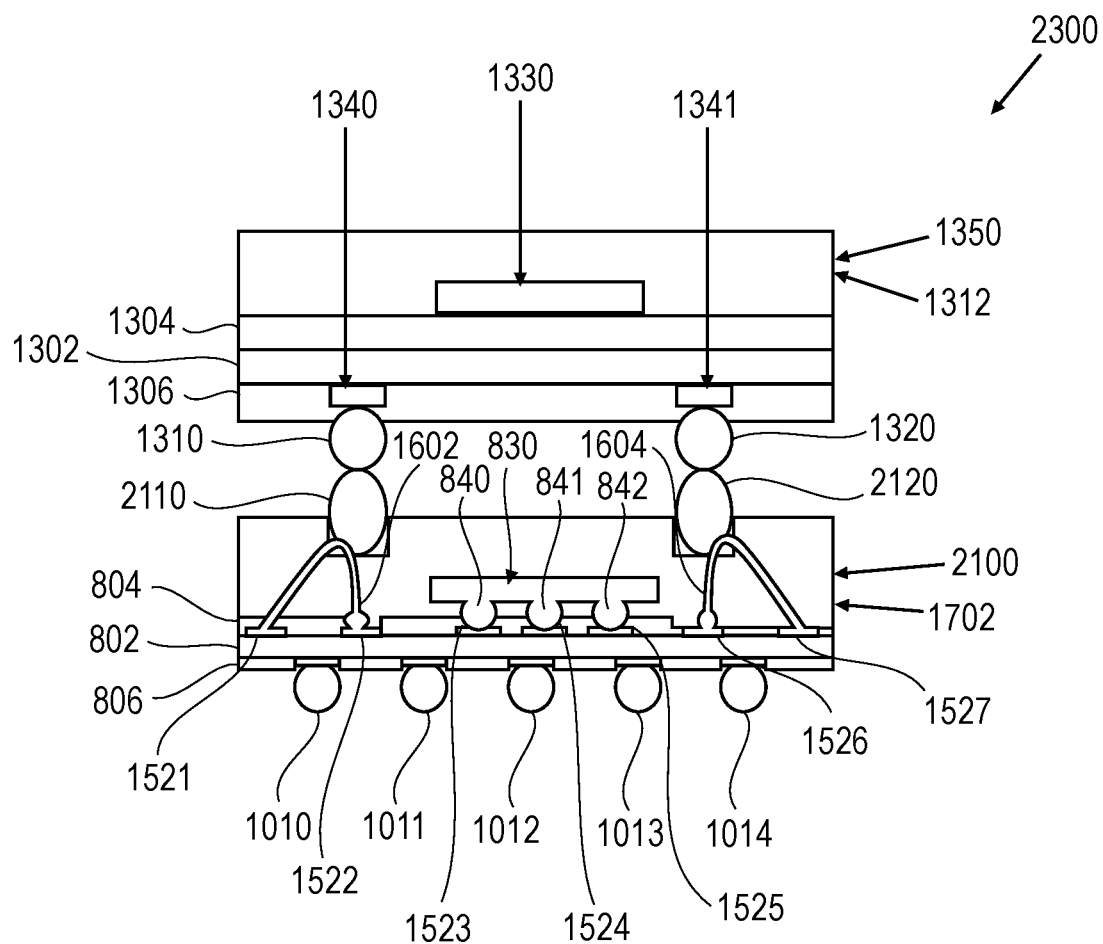
FIG. 22 illustrates the formation of a package-on-package with a relatively deep mold cap and wire loops that loop between respective conductive metallic pads.

For an alternative embodiment, package-on-package assembly 2300 of FIG. 22 is made up of upper package 1350 attached to lower package 2100. The attachment between packages 1350 and 2100 is accomplished by attaching solder balls (or bumps) 1310 and 1320 to respective solder balls (or bumps) 2110 and 2120. The attachment can be done using various soldering techniques, including reflow soldering.

Soldering balls (or bumps) 1310 and 1320 are attached to respective conductive metallic pads 1340 and 1341, which are part of layer 1306 and attached to the underside of foundation layer 1302, which for one embodiment is substrate 1302.

Package 1350 is also made up of a layer 1304 attached to substrate 1302. Integrated circuit 1330 is coupled to layer 1304. Mold cap 1312 covers integrated circuit 1330 and resides above layer 1304.

For alternative embodiments, substrate 1302 of FIGS. 12, 21, and 22 can be a printed circuit board. For alternative embodiments, electrical components can reside on substrate 1302 or on a printed circuit board. For alternative embodiments, various packages can be substituted for package 1350 of FIGS. 12, 21, and 22, including a system-in-package.

For alternative embodiments, substrate 802 of FIGS. 12, 21, and 22 can be a printed circuit board. For alternative embodiments, electrical components can reside on substrate 802 or on a printed circuit board.

Various semiconducting fabrication techniques and package-on-package fabrication techniques can be used in conjunction with the fabrication methods described above in connection with FIGS. 6 to 22.

Some operations in one or more embodiments of the process flows described herein may be omitted or performed in a sequence that is different from what is illustrated or described herein.

The terms "over," "to," "between," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments of a semiconductor package may also be used for other types of IC packages and mixed logic-memory package stacks. In addition, the processing sequences used to form one or more embodiments of a semiconductor package may be compatible with both wafer level packages ("WLP"), and integration with surface mount substrates such as Land Grid Array ("LGA"), Quad-Flat No Leads ("QFN"), and ceramic substrates.

Figure 23:
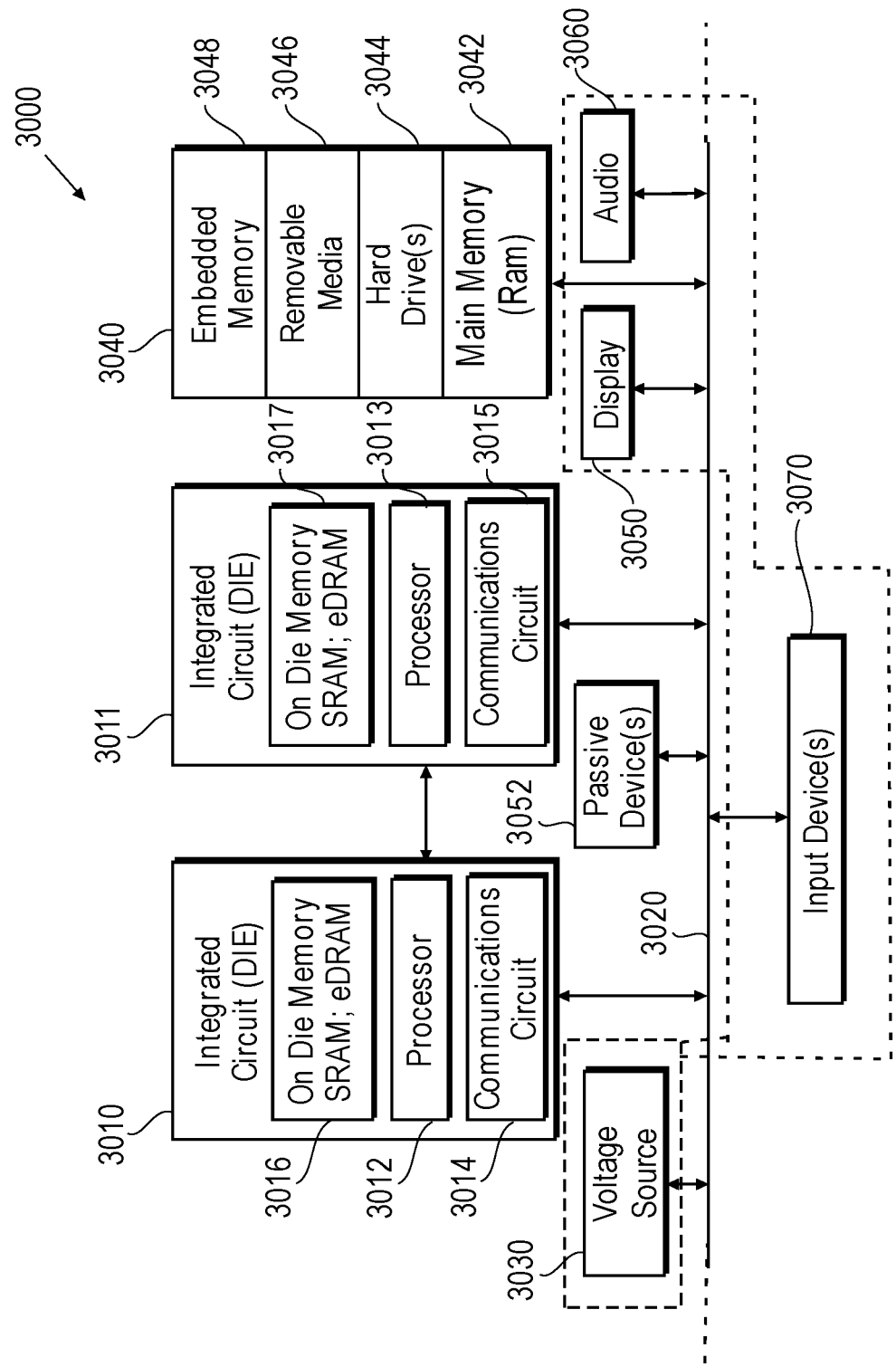
FIG. 23 illustrates a computer system that includes package-on-package technology with conductive wire through-mold interconnects.

The computer system 3000 (also referred to as the electronic system 3000) as depicted in FIG. 23 can embody packaging employing conductive wire through-mold interconnections, according to any of the several disclosed embodiments and their equivalents as set forth in this disclosure. The computer system 3000 may be a mobile device such as a netbook computer. The computer system 3000 may be a mobile device such as a wireless smart phone. The computer system 3000 may be a desktop computer. The computer system 3000 may be a hand-held reader. The computer system 3000 may be a server system. The computer system 3000 may be a supercomputer or high-performance computing system.

For an embodiment, the electronic system 3000 is a computer system that includes a system bus 3020 to electrically couple the various components of the electronic system 3000. The system bus 3020 is a single bus or any combination of buses according to various embodiments. The electronic system 3000 includes a voltage source 3030 that provides power to the integrated circuit 3010. For some embodiments, the voltage source 3030 supplies current to the integrated circuit 3010 through the system bus 3020.

The integrated circuit 3010 is electrically coupled to the system bus 3020 and includes any circuit, or combination of circuits according to an embodiment. For an embodiment, the integrated circuit 3010 includes a processor 3012 that can be of any type. As used herein, the processor 3012 may mean any type of circuit such as, but not limited to, a microprocessor, a microcontroller, a graphics processor, a digital signal processor, or another processor. In an embodiment, the processor 3012 includes, or is coupled with, packaging employing conductive wire through-mold interconnections, as disclosed herein. For an embodiment, SRAM embodiments are found in memory caches of the processor. Other types of circuits that can be included in the integrated circuit 3010 are a custom circuit or an application-specific integrated circuit (ASIC), such as a communications circuit 3014 for use in wireless devices such as cellular telephones, smart phones, pagers, portable computers, two-way radios, and similar electronic systems, or a communications circuit for servers. For an embodiment, the integrated circuit 3010 includes on-die memory 3016 such as static random-access memory (SRAM). For an embodiment, the integrated circuit 3010 includes embedded on-die memory 3016 such as embedded dynamic random-access memory (eDRAM).

For an embodiment, the integrated circuit 3010 is complemented with a subsequent integrated circuit 3011. Useful embodiments include a dual processor 3013 and a dual communications circuit 3015 and dual on-die memory 3017 such as SRAM. For an embodiment, the dual integrated circuit 3010 includes embedded on-die memory 3017 such as eDRAM.

For an embodiment, the electronic system 3000 also includes an external memory 3040 that in turn may include one or more memory elements suitable to the particular application, such as a main memory 3042 in the form of RAM, one or more hard drives 3044, and/or one or more drives that handle removable media 3046, such as diskettes, compact disks (CDs), digital variable disks (DVDs), flash memory drives, and other removable media known in the art. The external memory 3040 may also be embedded memory 3048 such as the first die in a die stack, according to an embodiment.

For an embodiment, the electronic system 3000 also includes a display device 3050, an audio output 3060. For an embodiment, the electronic system 3000 includes an input device such as a controller 3070 that may be a keyboard, mouse, trackball, game controller, microphone, voice-recognition device, or any other input device that inputs information into the electronic system 3000. For an embodiment, an input device 3070 is a camera. For an embodiment, an input device 3070 is a digital sound recorder. For an embodiment, an input device 3070 is a camera and a digital sound recorder.

As shown herein, the integrated circuit 3010 can be implemented in a number of different embodiments, including packaging employing conductive wire through-mold interconnections, according to any of the several disclosed embodiments and their equivalents, an electronic system, a computer system, one or more methods of fabricating an integrated circuit, and one or more methods of fabricating an electronic assembly that includes packaging employing conductive wire through-mold interconnections, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed packaging employing conductive wire through-mold interconnections and their equivalents. A foundation substrate may be included, as represented by the dashed line of FIG. 23. Passive devices 3052 may also be included, as is also depicted in FIG. 23.

The following are examples of embodiments.

For one embodiment, a microelectronic structure has a first package that includes a first foundation layer. A mold cap with a via is coupled to the first foundation layer. A first conductive pad is coupled to the first foundation layer. A conductive wire is wirebonded to the first conductive pad. The conductive wire extends to the via. A first solder structure is coupled to the conductive wire in the via to provide a connection to the first package.

For one embodiment, a second package has a second foundation layer and a second conductive pad coupled to the second foundation layer. A second solder structure is coupled to (1) the second conductive pad and (2) the first solder structure of the first package to couple the second package to the first package.

For one embodiment, the first foundation layer is a substrate. For another embodiment, the first foundation layer is a circuit board.

For one embodiment, the conductive wire is copper wire.

For one embodiment, the first package includes an integrated circuit coupled to the first conductive pad. For another embodiment, the first package includes an electrical component coupled to the first conductive pad.

For one embodiment, the first solder structure is a first solder ball.

For one embodiment, the conductive wire is a looped copper wire. For another embodiment, the conductive wire is a vertical copper wire.

For one embodiment, the second foundation layer of the second package is a substrate. For another embodiment, the second foundation layer of the second package is a circuit board.

Another embodiment is a microelectronic structure that has a first package and a printed circuit board. The first package has a mold cap coupled to a first foundation layer. The mold cap has a via. A first conductive pad is coupled to the first foundation layer. A conductive wire is wirebonded to the first conductive pad and extends to the via. A first solder structure is coupled to the conductive wire in the via to provide a connection to the first package. The printed circuit board has a second conductive pad and a second solder structure. The second solder structure is coupled to (1) the second conductive pad and (2) the first solder structure of the first package to couple the first package to the printed circuit board.

For another embodiment, a method of microelectronic fabrication includes forming a first conductive pad on a first foundation layer. A loop of conductive wire is wirebonded to the first conductive pad of the first foundation layer. A mold cap is formed on the first foundation layer. A via is formed in the mold cap to reach the conductive wire. A solder structure is formed and is coupled to the conductive wire.

For another embodiment, a second solder structure is attached to the first solder structure. The second solder structure is coupled to a second conductive pad coupled to a second foundation layer.

For one embodiment, the first foundation layer of the method of microelectronic fabrication is a substrate. For another embodiment, the first foundation layer of the method of microelectronic fabrication is a circuit board.

For one embodiment, a via is formed in the mold cap by laser drilling the mold cap.

For one embodiment, the second foundation layer of the method of microelectronic fabrication is a substrate of a second package. For another embodiment, the second foundation layer of the method of microelectronic fabrication is a circuit board.

Another embodiment is a method of microelectronic fabrication. First and second conductive pads are formed on a first foundation layer. A loop of conductive wire is wirebonded between the first and second conductive pads of the first foundation layer. A mold cap is formed on the first foundation layer. The mold cap is strip grinded to reduce a height of the mold cap and to cut the loop of conductive wire to form a vertical conductive wire. Laser ablation is used to form a via in the mold cap to extend to the vertical conductive wire. A solder structure is formed that is coupled to the vertical conductive wire.

For another embodiment, a second solder structure is attached to the first solder structure. The second solder structure is coupled to a second conductive pad coupled to a second foundation layer.

For one embodiment, the first foundation layer is a substrate of a first package and the second foundation layer is a substrate of a second package. For another embodiment, the first foundation layer is a substrate of a first package and the second foundation layer is a circuit board.

In the foregoing specification, the description has been with reference to specific exemplary embodiments. It will, however, be evident that various modifications and changes may be made thereto without departing from the spirit and scope. The specification and drawings are, accordingly, to be regarded in an illustrative rather than a restrictive sense.

What is claimed is:

1. A microelectronic structure comprising:
    a first package comprising:
        a first foundation layer;
        a mold cap with a via, wherein the mold cap is coupled to the first foundation layer;
        a first conductive pad coupled to the first foundation layer;
        a conductive wire wirebonded to the first conductive pad and extending to the via; and
        a first solder ball coupled to the conductive wire in the via to provide a connection to the first package;
    a second foundation layer; and
    a second solder ball coupling the second foundation layer to the first solder ball of the first package, wherein the second solder ball is directly on the first solder ball, the first solder ball is directly on the conductive wire, and wherein the second solder ball, the first solder ball and the conductive wire are in vertical alignment with one another.

2. The microelectronic structure of claim 1, wherein the first foundation layer comprises a substrate.

3. The microelectronic structure of claim 1, wherein the first foundation layer comprises a circuit board.

4. The microelectronic structure of claim 1, wherein the conductive wire comprises a copper wire.

5. The microelectronic structure of claim 1, wherein the first package further comprises an integrated circuit coupled to the first conductive pad.

6. The microelectronic structure of claim 1, wherein the first package further comprises an electrical component coupled to the first conductive pad.

7. The microelectronic structure of claim 1, wherein the conductive wire comprises a conductive vertical wire.

8. The microelectronic structure of claim 1, wherein the conductive wire comprises a conductive looped wire.

9. The microelectronic structure of claim 1, wherein the second foundation layer is included in a second package.

10. The microelectronic structure of claim 9, wherein the second foundation layer of the second package comprises a substrate.

11. The microelectronic structure of claim 9, wherein the second foundation layer of the second package comprises a circuit board.

12. The microelectronic structure of claim 1, further comprising:
    a printed circuit board comprising: a second conductive pad;
    a second solder structure coupled to (1) the second conductive pad and (2) the first solder structure of the first package to couple the first package to the printed circuit board.

* * * * *